(12) United States Patent
Saito et al.

(10) Patent No.: US 9,116,169 B2
(45) Date of Patent: Aug. 25, 2015

(54) METHOD FOR ALIGNING PLATE-LIKE MEMBERS AND METHOD FOR MANUFACTURING ELECTRICAL CONNECTING APPARATUS

(71) Applicant: Kabushiki Kaisha Nihon Micronics, Tokyo (JP)

(72) Inventors: Tomokazu Saito, Aomori (JP); Seito Moriyama, Aomori (JP)

(73) Assignee: Kabushiki Kaisha Nihon Micronics, Musashino-shi, Tokyo (JP)

(*) Notice: Subject to any disclaimer, the term of this patent is extended or adjusted under 35 U.S.C. 154(b) by 0 days.

(21) Appl. No.: 14/472,074

(22) Filed: Aug. 28, 2014

(65) Prior Publication Data

US 2014/0367453 A1  Dec. 18, 2014

Related U.S. Application Data

(62) Division of application No. 13/720,748, filed on Dec. 19, 2012, now Pat. No. 8,851,358.

(30) Foreign Application Priority Data

Dec. 21, 2011  (JP) ................................. 2011-279736

(51) Int. Cl.
*G01R 3/00* (2006.01)
*B23K 31/02* (2006.01)
*G01R 1/073* (2006.01)
*B23K 1/00* (2006.01)
*B23K 1/20* (2006.01)

(52) U.S. Cl.
CPC ............... *G01R 3/00* (2013.01); *B23K 1/0008* (2013.01); *B23K 31/02* (2013.01); *G01R 1/07307* (2013.01); *B23K 1/20* (2013.01)

(58) Field of Classification Search
CPC ............... H01L 2224/32225; H01L 2924/00; H01L 2224/73204; H01L 2224/73265; H01L 2224/48247; H01L 21/50; H01L 23/147; H01L 23/3128; H01L 23/345; H01L 23/488; H05K 1/056; B23K 2201/42; B23K 35/268
USPC .......................... 228/256; 174/258, 261, 266; 257/E21.499; 324/754.03, 755.05, 324/756.03, 762.05; 438/117
See application file for complete search history.

(56) References Cited

U.S. PATENT DOCUMENTS

| 6,594,892 B2* | 7/2003 | Ohya et al. ........................ 29/846 |
| 2003/0111518 A1* | 6/2003 | Dances ........................... 228/215 |
| 2009/0008801 A1* | 1/2009 | Lai et al. ........................ 257/782 |

* cited by examiner

*Primary Examiner* — Erin Saad
(74) *Attorney, Agent, or Firm* — Ingrassia Fisher Lorenz, P.C.

(57) ABSTRACT

One plate-like member and the other plate-like member to be aligned with each other are provided with guide holes and guide portions to be received in the guide holes, respectively. The plate-like members are aligned appropriately, and in a state in which this alignment is held, the guide portions are formed on land portions provided on the other plate-like member so as to be aligned with the guide holes. Accordingly, regardless of presence/absence or size of a process error in the guide holes, the guide portions appropriate to the respective guide holes can be formed. Consequently, by aligning the guide portions with the guide holes, the plate-like members can be aligned appropriately without relative fine adjustment between the members.

3 Claims, 4 Drawing Sheets

METHOD FOR ALIGNING PLATE-LIKE MEMBERS AND METHOD FOR MANUFACTURING ELECTRICAL CONNECTING APPARATUS

RELATED APPLICATIONS

This application is a divisional of U.S. patent application Ser. No. 13/720,748, filed Dec. 19, 2012, which claims the benefit of, and claims priority to, Japanese patent application number 2011-279736, filed on Dec. 21, 2011.

TECHNICAL FIELD

The subject matter relates to a method for aligning two plate-like members and a method for manufacturing an electrical connecting apparatus such as a probe card for use in an electrical test of a semiconductor device such as a semiconductor integrated circuit.

BACKGROUND

Semiconductor devices such as multiple semiconductor integrated circuits formed on a semiconductor wafer undergo an electrical test in a semiconductor wafer state to determine whether or not they are manufactured in accordance with a specification before being separated into respective chips. In this electrical test with use of the semiconductor wafer as a device under test, a probe card is used in general to electrically connect a tester to the device under test.

An example of this probe card includes a connection base plate and multiple bar-like so-to-speak vertical probes connected to conductive paths of the connection base plate. As for the respective probes, in a state in which connection end portions thereof to the connection base plate are arrayed by a holding means holding the multiple probes, the connection end portions are connected to corresponding connection pads of the connection base plate by solder, for example (for example, refer to Patent Literature 1).

Prior to soldering of the connection end portions of the multiple probes held in this holding means to the corresponding connection pads, the holding means holding these probes and the connection base plate on which the connection pads are provided need to be aligned with each other appropriately so that the connection end portions of the respective probes may be located on the corresponding connection pads appropriately.

In general, for this alignment, the connection base plate is provided with a guide pin projecting toward the holding means while the holding means is provided with a guide hole adapted to receive the guide pin. These guide pin and guide hole are designed at the time of designing of the connection base plate and the holding means so as to be located at appropriate positions. However, when the holding means is made of a non-metallic hard material such as a ceramic plate, a problem occurs in enhancement of process accuracy of the guide hole. Accordingly, even in a case where the connection base plate and the holding means are combined so that the guide pin of the connection base plate and the guide hole of the holding means such as the ceramic plate may be aligned, mainly a process error of the guide hole may cause another relative fine adjustment on a plane to be required so that all the connection pads on the connection base plate and the connection end portions of the corresponding probes held in the holding means may be aligned appropriately.

Especially, when the number of probes in a probe base plate increases along with an increase in the degree of integration of the integrated circuit, it is not easy to do adjustment appropriately by human hand so that all the probes and the connection pads may be aligned, and the manual fine adjustment requires skill.

CITATION LIST

Patent Literature 1: Japanese National Patent Appln. Public Disclosure No. 2009-162483

SUMMARY

In aligning a plate member such as a holding plate holding multiple probes with a plate member such as a connection base plate provided with connection pads for the probes appropriately, an alignment method that dispenses with planar fine adjustment between the plate members is provided.

Basically, a method for aligning two plate-like members according to an embodiment relatively aligning the two plate-like members having planes that can be opposed to each other in a state in which the planes of the two plate-like members in which at least one plate-like member is made of a non-metallic material are opposed to each other for the purpose of preventing movement along the planes includes forming a plurality of land portions respectively having metal surfaces on the plane of the other plate-like member, forming through holes provided in the one plate-like member to correspond to the land portions and enabling at least parts of respective open ends opened to the plane of the other plate-like member to be closed by the metal surfaces of the corresponding land portions, relatively aligning the two members with each other so that the through holes and the land portions of the two members corresponding to each other may be opposed and so that the metal surfaces of the land portions may close the at least parts of the open ends of the corresponding through holes, arranging solder materials on the land portions in the through holes in a state in which alignment is held, thermally melting the solder materials in the through holes on the land portions to form guide portions extending along circumferential surfaces of the through holes in the corresponding through holes from the land portions by solidification of the solder materials, and relatively aligning the two plate-like members for the purpose of preventing mutually parallel movement of the two plate-like members by engagement of the guide portions with the circumferential surfaces of the corresponding through holes.

In the aligning method according to the embodiment, the through holes provided in the one plate-like member are guide holes for the guide portions to be formed by the solder materials on the land portions of the other plate-like member. That is, the guide portions function as guide pins while the though holes receiving the guide portions function as guide holes. With the method according to the embodiment, the guide pins to be received in the guide holes are formed on the land portions so as to be aligned with the guide holes. Thus, as long as the members are aligned appropriately, and the guide portions are formed in a state in which this alignment is held, the guide pins appropriate to the respective guide holes can be formed regardless of presence/absence or size of a process error in the guide holes or the through holes. Accordingly, by aligning the guide portions with the through holes as the guide holes, the plate-like members can be aligned appropriately without relative fine adjustment between the members.

The open ends can be formed to surround the land portions corresponding to the open ends. This is advantageous in terms of strength of the guide portions since this enables the guide portions functioning as the guide pins to erect from approximately the entire areas of top surfaces of the land portions.

The one plate-like member to be provided with the through holes can be a ceramic plate. Regardless of size of a process error along with a process to a hard material such as the ceramic plate, the plate-like members can be aligned appropriately.

The aligning method according to the embodiment can be applied to a method for manufacturing an electrical connecting apparatus such as a probe card or an interposer to be incorporated in the probe card.

That is, a method for manufacturing an electrical connecting apparatus according to another embodiment includes preparing a connection base plate having a surface provided with a plurality of connection pads to which probes are to be connected and a plurality of land portions having metal surfaces, preparing a plurality of probes having connection end portions to the connection pads, preparing a holding plate made of a non-metallic material in which probe through holes adapted to make the respective connection end portions of the probes opposed to the corresponding connection pads and to hold the connection end portions and land through holes provided to correspond to the land portions, having open ends opened to the corresponding land portions, and enabling at least parts of the respective open ends to be closed by the corresponding land portions are formed respectively in a plate thickness direction, approximating opposed surfaces of the connection base plate and the holding plate to each other to relatively align the plates with each other so that the respective probe through holes may be opposed to the corresponding connection pads of the connection base plate, so that the respective land through holes may be opposed to the corresponding land portions of the connection base plate, and so that the land portions may close the at least parts of the open ends of the respective corresponding land through holes, arranging solder materials on the land portions in the land through holes, thermally melting the solder materials in the land through holes on the land portions in a state in which alignment between the connection base plate and the holding plate is held to form guide portions extending along circumferential surfaces of the land through holes in the corresponding land through holes from the land portions by solidification of the solder materials, separating the connection base plate and the holding plate so that the guide portions may be escaped from the land through holes, arranging the respective probes appropriately in the respective probe through holes of the separated holding plate, and by making the guide portions of the connection base plate fitted in the land through holes of the holding plate in a state in which the connection end portions of the respective probes arranged in the holding plate are opposed to the corresponding connection pads, aligning the connection base plate and the holding plate with each other so that the respective connection end portions of the probes may correspond to the respective corresponding connection pads of the connection base plate, and fixing the respective connection end portions of the probes to the respective corresponding connection pads of the connection base plate in a state in which the holding plate and the connection base plate are relatively aligned.

The respective connection end portions of the probes can be fixed to the respective corresponding connection pads of the connection base plate with use of solder materials.

After separating the connection base plate and the holding plate so that the guide portions may be escaped from the land through holes and before making the guide portions of the connection base plate fitted in the land through holes of the holding plate, the solder materials can be arranged on the connection pads of the connection base plate. The solder materials on the connection pads can be melted and solidified in a state in which the holding plate and the connection base plate are relatively aligned to cause the respective connection ends of the probes to be fixed to the respective corresponding connection pads of the connection base plate.

The solder materials can be melted with used of a heating furnace.

The solder materials can be solder balls or solder pastes.

With the aligning method according to the embodiment, the plate-like members are aligned appropriately, and in a state in which this alignment is held, with the through holes of the one plate-like member functioning as the guide holes, the guide portions are formed on the land portions provided on the other plate-like member so as to be aligned with the guide holes. Accordingly, regardless of presence/absence or size of a process error in the guide holes, the guide portions appropriate to the respective guide holes can be formed. Consequently, by aligning the guide portions with the guide holes, the plate-like members can be aligned appropriately without relative fine adjustment between the members.

BRIEF DESCRIPTION OF THE DRAWINGS

FIG. 1A illustrates a process of preparing a connection base plate as a probe base plate, FIG. 1B illustrates a process of preparing a holding plate and aligning the holding plate with the probe base plate, and FIG. 1C illustrates a process of arranging solder materials in a state in which the holding plate and the probe base plate are aligned.

FIG. 3A illustrates a process of forming guide portions and thereafter separating the holding plate from the probe base plate following the process in FIG. 2, FIG. 3B illustrates a process of arranging probes in the separated holding plate, and FIG. 3C illustrates a process of relatively aligning the holding plate provided with the probes with the probe base plate provided with the guide portions.

DETAILED DESCRIPTION

Hereinafter, a method for manufacturing an electrical connecting apparatus according to an embodiment will be described taking as an example a method for manufacturing a probe card as one of the electrical connecting apparatuses.

Figure 1A:
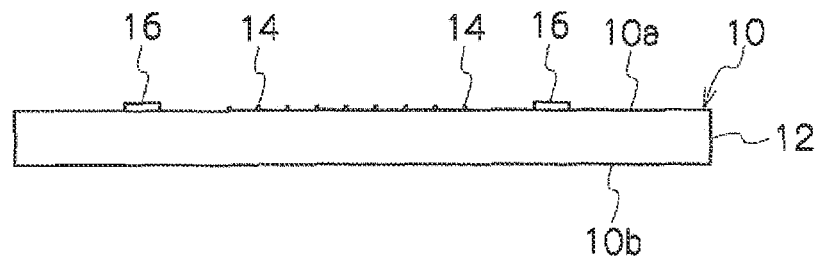
FIG. 1A to FIG. 1C illustrate an example of applying a manufacturing method according to an embodiment to manufacture of a probe card.

In a method for manufacturing a probe card according to an embodiment, a connection base plate 10 as a probe base plate of a probe card is prepared as illustrated in FIG. 1A.

As is conventionally well known, this connection base plate 10 includes a plate-like electrical insulating body 12 having flat surfaces 10a and 10b parallel to each other and wiring paths (not illustrated) incorporated in the electrical insulating body.

On one surface of the electrical insulating body 12 or one surface 10a of the connection base plate 10 are arrayed multiple connection pads 14 connected to the respective wiring paths and made of metal layers. Also, on one surface 10a of the connection base plate 10 are provided at least two land portions 16 spaced from each other at external sides of an area in which the connection pads 14 are arranged and arranged to be electrically separated from the wiring paths. The land portions are made of metal layers formed in desired flat shapes such as rectangular shapes or circular shapes such as square shapes or rectangular shapes and can be formed on one surface 10a of the connection base plate 10 with use of a plating method, for example.

On the other surface 10b of the connection base plate 10 are provided conventionally well-known connection terminals (not illustrated) connected to the respective wiring paths of the connection base plate 10 and adapted to connect the corresponding connection pads 14 to an electric circuit of a not illustrated tester.

Figure 1B:
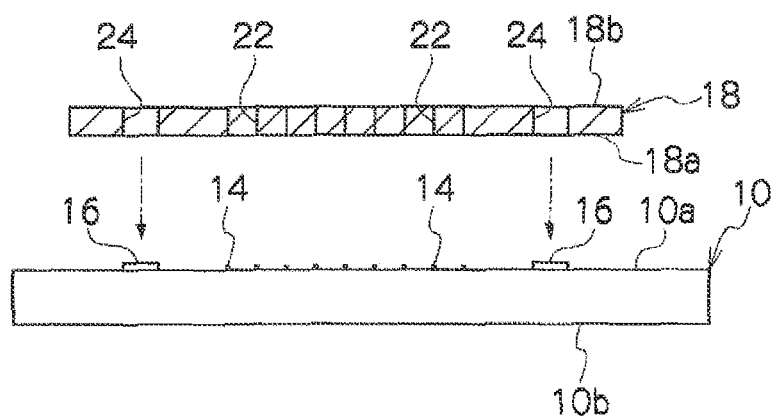

As illustrated in FIG. 1B, a holding plate 18 to be combined with the connection base plate 10 is prepared. The holding plate 18 is made of a non-metallic material such as a ceramic plate and has surfaces 18a and 18b parallel to each other. In this holding plate 18 are formed multiple probe through holes 22 arranged to correspond to the connection pads 14 of the connection base plate 10 and penetrating the holding plate 18 in a plate thickness direction so as to allow after-mentioned probes to pass therethrough. At external sides of an area in the holding plate 18 in which the probe through holes 22 are arranged are formed land through holes 24 corresponding to the land portions 16 of the connection base plate 10.

Each of the land through holes 24 has an equal-size opening in an axial direction thereof, and a cross-sectional shape of the opening can be basically formed in a desired shape such as a rectangular shape or a circular shape regardless of how a flat surface of each land portion 16 is formed. The diameter of the opening of the land through hole 24 can be slightly increased from the other surface 18b to one surface 18a of the holding plate 18.

The holding plate 18 is aligned to make one surface 18a thereof face one surface 10a of the connection base plate 10 so that the respective probe through holes 22 may be aligned with the corresponding connection pads 14 in a state in which the surfaces 18a and 10a are held to be parallel to each other.

For the alignment between the holding plate 18 and the connection base plate 10, a conventionally well-known xyzθ operating table, a pair of upper and lower photographing means, and a control unit operating the operating table based on image information obtained by the photographing means can be used, for example, although these are not illustrated in figures. In this case, for example, the connection base plate 10 is arranged on the operating table with one surface 10a thereof facing the upper side. On the other hand, the holding plate 18 is held in a not illustrated fixing frame on the upper side of the connection base plate 10 to make one surface 18a opposed to one surface 10a of the connection base plate 10. For example, the control unit rotates and operates the operating table along x, y, z, and θ axes based on positional information of one surface 10a of the connection base plate 10 obtained by an image from a lower camera as the photographing means held on the operating table and positional information of the surface 18b of the holding plate 18 obtained by an image from an upper camera as the photographing means held on the fixing frame. By this operation of the operating table, the holding plate 18 and the connection base plate 10 are aligned accurately so that the respective probe through holes 22 may be aligned with the corresponding connection pads 14.

Figure 1C:
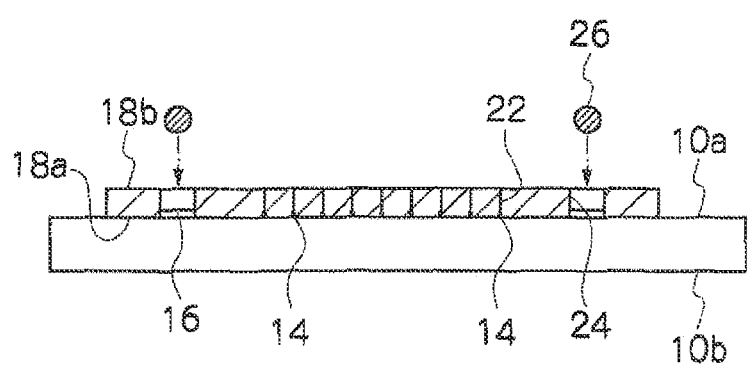

By this alignment, open ends of the land through holes 24 on one surface 18a of the holding plate 18 are opened over the corresponding land portions 16. Accordingly, as illustrated in FIG. 1C, when the operating table is moved in the z axial direction, and thus one surface 10a of the connection base plate 10 approximates to one surface 18a of the holding plate 18, at least parts of the open ends of the land through holes 24 on one surface 18a of the holding plate 18 overlap surfaces of the corresponding land portions 16 and are closed by the surfaces. In other words, overlapping areas of the surfaces of the land portions 16 overlapping the open ends of the land through holes 24 are exposed to the open ends of the land through holes 24.

In the illustrated example, the open ends of the land through holes 24 have sizes and similar shapes sufficient to house the entire surfaces of the corresponding land portions 16. Accordingly, in a state in which one surface 10a of the connection base plate 10 and one surface 18a of the holding plate 18 abut on each other, relative fine adjustment between the plates 10 and 18 can be performed on a plane (10a or 18a) of the connection base plate 10 or the holding plate 18 or on an xy plane for more accurate alignment between the probe through holes 22 and the connection pads 14.

In this alignment state, a relative position of the connection base plate 10 and the holding plate 18 is preferably determined temporarily with use of a temporary fixing means such as a not illustrated clamp mechanism.

Subsequently, solder materials 26 such as spherical solder balls or solder pastes are supplied in the land through holes 24 from the other surface 18b of the holding plate 18 and are arranged on the land portions 16.

Figure 2:
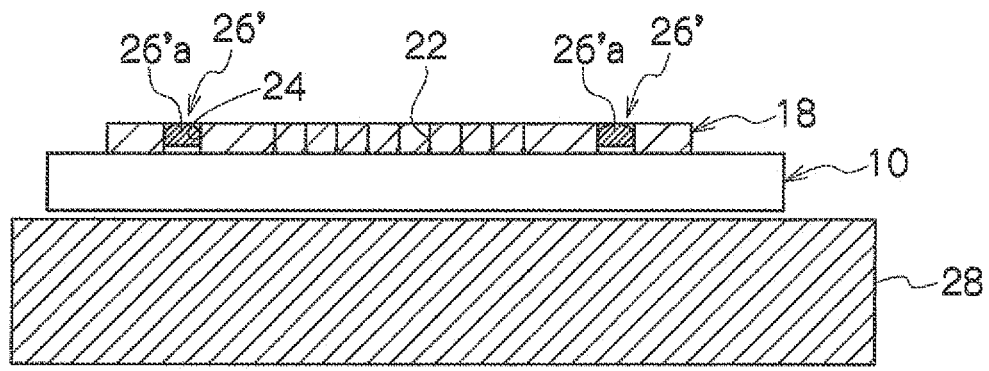
FIG. 2 illustrates a process of melting and solidifying the solder materials following the process in FIG. 1C.

In a state in which the solder materials 26 are arranged, the connection base plate 10 and the holding plate 18 that are temporarily fixed are arranged on a reflow heater 28 in a heating furnace as illustrated in FIG. 2. The solder materials 26 are melted on the land portions 16 in the land through holes 24 by heating by this reflow heater 28. After the melting, the solder materials 26 are solidified by cooling, and the solder materials 26 are solidified along inner circumferential surfaces of the land through holes 24 at this time. Thus, by solidification of the solder materials 26, guide portions 26' corresponding to the corresponding land through holes 24 and fitted in the through holes are formed on the respective land portions 16.

With regard to formation of these guide portions 26', the open ends of the probe through holes 22 opened on the land portions 16 of the connection base plate 10 are preferably formed to cover the land portions 16 corresponding to the open ends so as to surround the land portions 16. This is advantageous in terms of strength of the guide portions 26' since this enables the guide portions 26' functioning as after-mentioned guide pins to erect from approximately the entire areas of top surfaces of the land portions 16.

Also, the guide portions 26' are formed by solidification of the molten solders. At the time of solidification of the molten solders, the guide portions 26' are provided with semispherical tip end portions 26'a directing upward by surface tension of the molten solders.

Figure 3A:
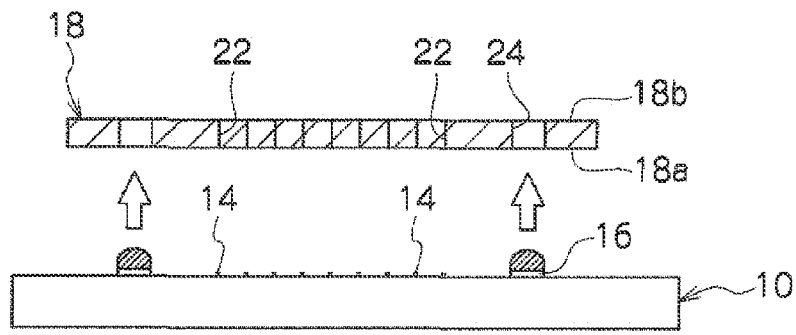
FIG. 3A to FIG. 3C illustrate a method for manufacturing a probe card according to an embodiment.
Figure 3B:
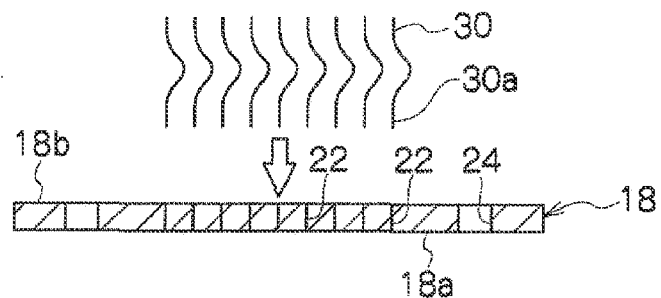

After formation of the guide portions 26', the connection base plate 10 and the holding plate 18 are separated from each other as illustrated in FIG. 3A. Since the holding plate 18 in which the land through holes 24 are formed is made of a non-metallic material, the solder materials 26 are not fixed firmly to the circumferential surfaces of the land through holes 24 at the time of solidification of the solder materials 26. Thus, in the separation of the connection base plate 10 and the holding plate 18, the holding plate 18 can be pulled from the connection base plate 10 relatively easily.

In the respective probe through holes 22 of the separated holding pate 18 are inserted respective probes 30 from the other surface 18b of the holding plate 18 as illustrated in FIG.

3B. The respective probes 30 are provided with connection ends 30a to the connection pads 14 and are held in the holding plate 18 so that the connection ends may project slightly from one surface 18a of the holding plate 18. For holding of the probes 30, a holding means made of an adhesive material such as wax can be applied to the probe through holes 22, for example.

After arrangement of the probes 30 in the holding plate 18, solder materials adapted to fix the probes 30 are arranged to the respective connection pads 14 of the connection base plate 10.

Figure 3C:
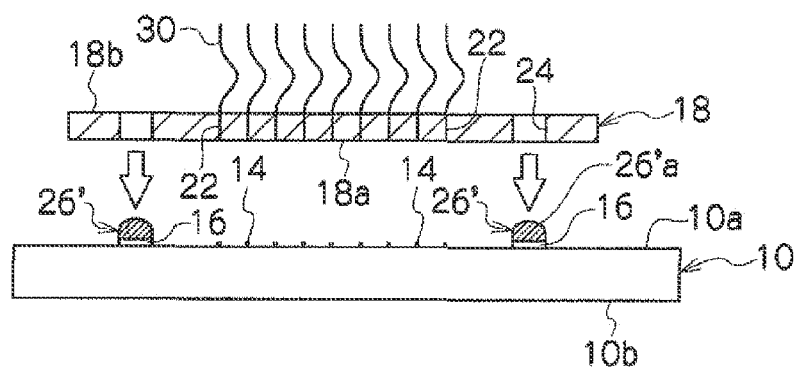

As illustrated in FIG. 3C, the land through holes 24 of the holding plate 18, in which the respective probes 30 have been arranged appropriately, are fitted to the corresponding guide portions 26' of the connection base plate 10 in a state in which one surface 18a of the holding plate 18 is opposed to one surface 10a of the connection base plate 10 so that the connection ends 30a of the probes 30 projecting from one surface 18a of the holding plate may face the corresponding connection pads 14.

When the land through holes 24 of the holding plate 18 are to be fitted to the corresponding guide portions 26' of the connection base plate 10, the semispherical tip end portions 26'a of the guide portions 26' guide the open ends of the land through holes 24 to appropriate positions. Thus, a guiding effect of the tip end portions 26'a enables the land through holes 24 of the holding plate 18 to be fitted to the corresponding guide portions 26' of the connection base plate 10 appropriately without generation of breakage or deformation in the guide portions 26'.

Plate-like members 10 and 18 are aligned with each other so that the connection pads 14 of the connection base plate 10 may be aligned with the probe through holes 22 of the holding plate 18 appropriately, and in a state in which this alignment is held, with the land through holes 24 of the holding plate 18 as one plate-like member functioning as guide holes, the guide portions 26' functioning as guide pins are formed on the land portions 16 provided on the connection base plate 10 as the other plate-like member so as to be aligned with the guide holes. Accordingly, regardless of presence/absence or size of a process error in the guide holes 24, the guide portions 26' appropriate to the respective guide holes 24 can be formed. Consequently, as described above, by fitting the land through holes 24 of the holding plate 18 to the corresponding guide portions 26' of the connection base plate 10, the connection pads 14 of the connection base plate 10 and the probe through holes 22 of the holding plate 18 can be aligned without relative fine adjustment between the connection base plate 10 and the holding plate 18, and the connection ends 30a of the respective probes 30 projecting from the probe through holes 22 can be aligned with the corresponding connection pads 14 appropriately.

Thus, as described with reference to FIG. 3C, by fitting the land through holes 24 of the holding plate 18 to the corresponding guide portions 26' of the connection base plate 10, the connection ends 30a of the respective probes 30 projecting from the probe through holes 22 can be aligned with the corresponding connection pads 14 appropriately. Accordingly, by relatively fixing the connection base plate 10 and the holding plate 18 with use of an aligning means such as a clamp mechanism in this state and melting and solidifying the solder materials on the connection pads 14 with use of a heating furnace such as one described above in this fixing state, the connection ends 30a of the respective probes 30 in the holding plate 18 can be fixed to the corresponding connection pads 14. By this heating treatment, the guide portions 26' on the land portions 16 are partially melted, but since the connection base plate 10 and the holding plate 18 are fixed relatively by the aligning means such as the clamp mechanism, partial melting of the guide portions 26' will not cause a problem.

Figure 4:
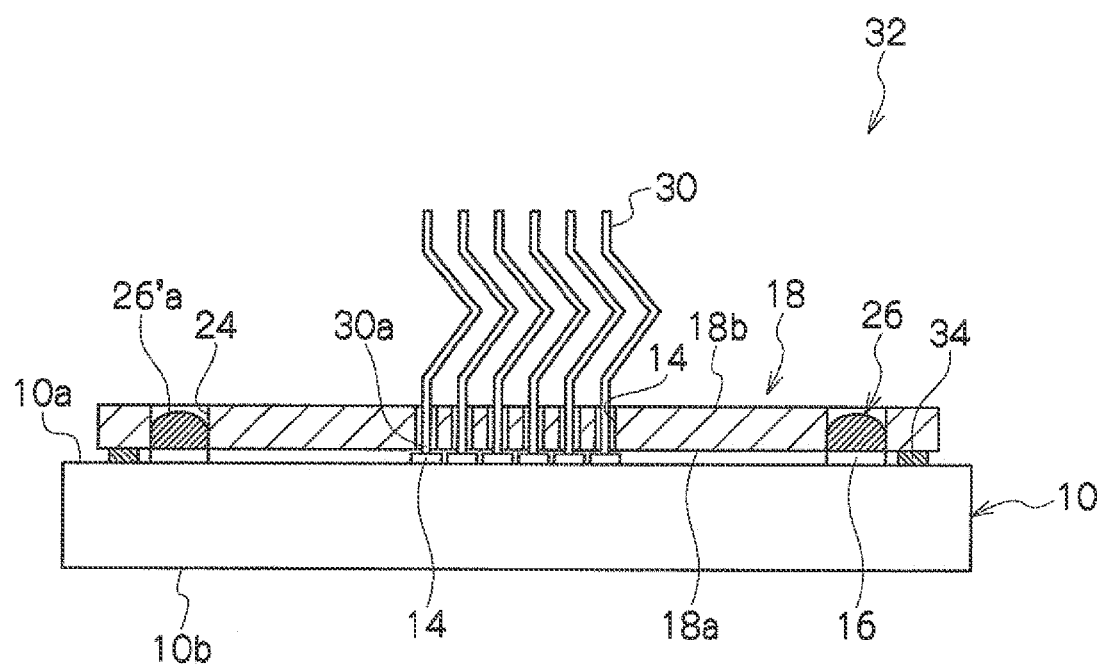
FIG. 4 is a cross-sectional view schematically illustrating a probe card formed by the manufacturing method according to the embodiment.

Consequently, this dispenses with another relative fine adjustment to align all the connection pads 14 of the connection base plate 10 with the connection ends 30a of the corresponding probes 30 held in the holding plate 18 appropriately, and a probe card 32 as illustrated in FIG. 4 can be manufactured relatively easily.

In the example illustrated in FIG. 4, in order to compensate for thicknesses of the connection pads 14 and the land portions 16, an annular spacer 34 is applied between opposed surfaces 10a and 18a of the connection base plate 10 and the holding plate 18 prior to fitting of the land through holes 24 of the holding plate 18 to the guide portions 26' of the connection base plate 10 as illustrated in FIG. 3C. A case where the connection pads 14 and the land portions 16 are sufficiently thin can dispense with the spacer 34.

In the foregoing description, although an example in which the solder materials are used for fixing of the probes 30 to the connection pads 14 has been described, a conductive adhesive or a pressure bonding or pressure welding means can be applied instead of the solders as a fixing means between the connection pads 14 and the probes 30.

The described subject matter is not limited to the above embodiments but may be altered in various ways without departing from the spirit and scope presented here. For example, the manufacturing method according to the present embodiment can be applied to manufacture of an electrical connecting apparatus such as a conventionally well-known interposer applied to connection of electric circuits between a probe base plate of a probe card and a wiring base plate of the probe card.

Also, the method according to the present embodiment can be applied not only to a method in the electrical connection apparatus but also to a method for relatively aligning two plate-like members having planes that can be opposed to each other in a state in which the planes of the two plate-like members in which at least one plate-like member is made of a non-metallic material are opposed to each other for the purpose of preventing movement along the planes.

What is claimed is:

1. A method for aligning first and second plate-like members, wherein the first plate-like member is made of a non-metallic material, the method comprising:
forming a plurality of land portions having respective metal surfaces on the second plate-like member;
forming land through holes in the first plate-like member to correspond to the land portions in the second plate-like member;
aligning the first plate-like member with the second plate-like member so that the land through holes of the first plate-like member oppose corresponding land portions of the second plate-like member, and so that metal surfaces of the land portions close open ends of the corresponding land through holes;
arranging solder materials on the land portions exposed in the land through holes when the first plate-like member is aligned with the second plate-like member;
thereafter, thermally melting the solder materials on the land portions to form guide portions by solidification of the solder materials, the guide portions extending from the land portions and along circumferential surfaces of the land through holes;
after forming the guide portions, separating the first plate-like member and the second plate-like member from each other, wherein the guide portions remain extending from the land portions after the separating;

after the separating, inserting probes into respective probe through holes formed in the first plate-like member; and after inserting the probes, fitting the land through holes to corresponding guide portions to align the first plate-like member and the second plate-like member with each other, wherein engagement of the guide portions with the corresponding land through holes prevents mutually parallel movement of the first and second plate-like members.

2. The method according to claim 1, wherein the open ends of the land through holes surround corresponding land portions when the first and second plate-like members are relatively aligned with each other.

3. The method according to claim 1, wherein the first plate-like member is made of a ceramic plate.

* * * * *